United States Patent
Tamai et al.

(10) Patent No.: US 10,497,586 B2
(45) Date of Patent: Dec. 3, 2019

(54) SEMICONDUCTOR DEVICE AND A METHOD OF MANUFACTURING THE SAME

(71) Applicant: FUJI ELECTRIC CO., LTD., Kawasaki-shi, Kanagawa (JP)

(72) Inventors: Yuta Tamai, Matsumoto (JP); Fumihiko Momose, Nagano (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 11 days.

(21) Appl. No.: 15/626,032

(22) Filed: Jun. 16, 2017

(65) Prior Publication Data
US 2017/0372977 A1 Dec. 28, 2017

(30) Foreign Application Priority Data
Jun. 22, 2016 (JP) .................. 2016-123296

(51) Int. Cl.
| | |
|---|---|
| H01L 23/00 | (2006.01) |
| H01L 21/52 | (2006.01) |
| H01L 23/492 | (2006.01) |
| H01L 23/498 | (2006.01) |
| H01L 23/367 | (2006.01) |
| H01L 23/10 | (2006.01) |
| H01L 23/057 | (2006.01) |
| H01L 23/36 | (2006.01) |
| H01L 25/07 | (2006.01) |

(Continued)

(52) U.S. Cl.
CPC ............ *H01L 21/52* (2013.01); *H01L 23/057* (2013.01); *H01L 23/10* (2013.01); *H01L 23/36* (2013.01); *H01L 23/3675* (2013.01); *H01L 23/492* (2013.01); *H01L 23/498* (2013.01); *H01L 23/3735* (2013.01); *H01L 23/562* (2013.01); *H01L 25/072* (2013.01); *H01L 25/115* (2013.01); *H01L 2224/32225* (2013.01); *H01L 2924/13055* (2013.01); *H01L 2924/13091* (2013.01)

(58) Field of Classification Search
CPC ...................................................... H01L 23/562
See application file for complete search history.

(56) References Cited

U.S. PATENT DOCUMENTS

2007/0044558 A1* 3/2007 Ohta ..................... G01C 19/56
73/493

FOREIGN PATENT DOCUMENTS

| JP | H05-121626 A | 5/1993 |
| JP | 2010-098036 A | 4/2010 |
| JP | 2013-235882 A | 11/2013 |

* cited by examiner

*Primary Examiner* — Peniel M Gumedzoe
*Assistant Examiner* — Christopher A Johnson
(74) *Attorney, Agent, or Firm* — Rabin & Berdo, P.C.

(57) ABSTRACT

A semiconductor device has a U terminal with an internal joint portion at one end that is joined to a circuit board, an intermediate portion that is embedded in a case, and an external joint portion at another end that is exposed from the case, the U terminal being provided with a shock absorbing portion that is positioned between an inner surface of the case and the internal joint portion and absorbing stress that acts upon the internal joint portion. Due to the presence of the shock absorbing portion, even when the entire semiconductor device deforms or there is local deformation such that stress becomes concentrated at the joined surfaces of the internal joint portion and the circuit board, the stress is absorbed by the shock absorbing portion.

11 Claims, 6 Drawing Sheets

(51) Int. Cl.
*H01L 25/11* (2006.01)
*H01L 23/373* (2006.01)

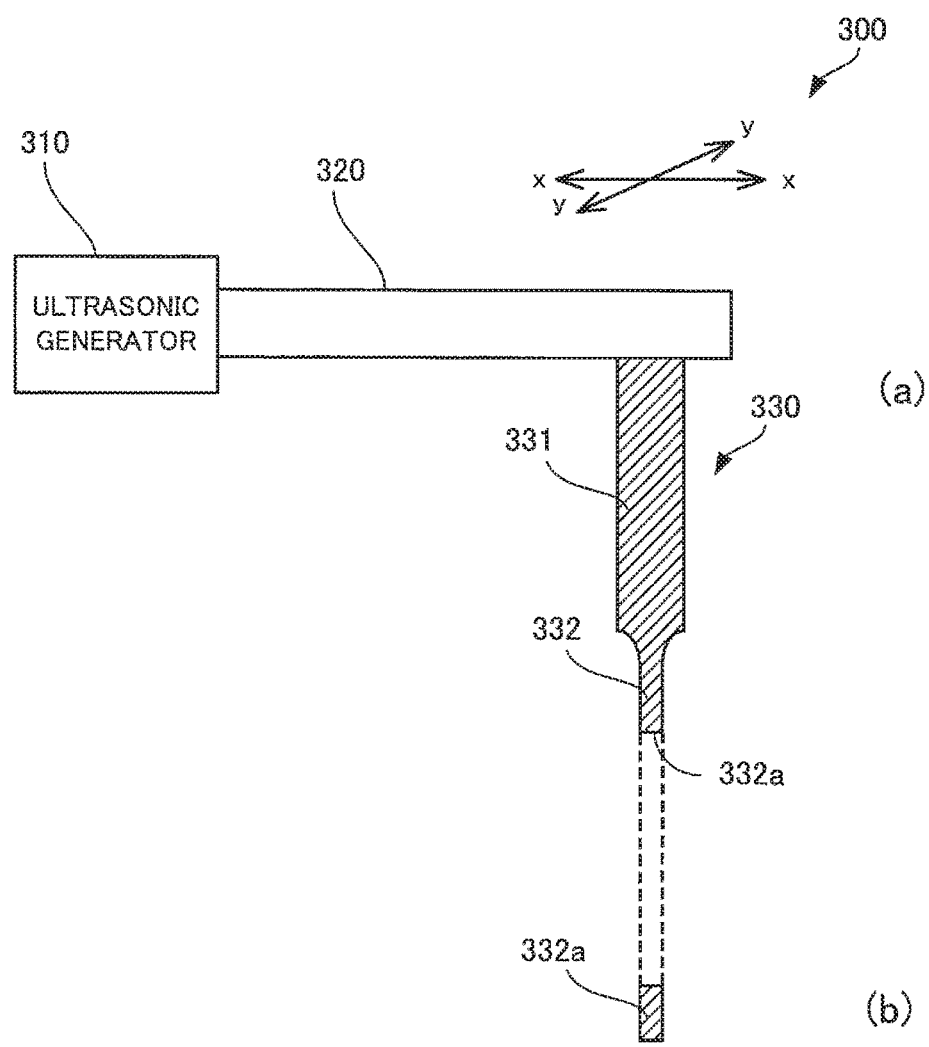
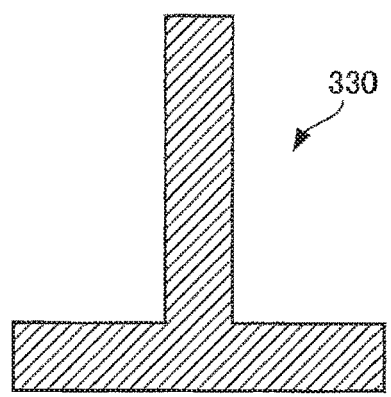
FIG. 5A
FIG. 5B

SEMICONDUCTOR DEVICE AND A METHOD OF MANUFACTURING THE SAME

CROSS-REFERENCE TO RELATED APPLICATION

This application is based upon and claims the benefit of priority of the prior Japanese Patent Application No. 2016-123296, filed on Jun. 22, 2016, the entire contents of which are incorporated herein by reference.

BACKGROUND OF THE INVENTION

1. Field of the Invention

The embodiments discussed herein are related to a semiconductor device and a method of manufacturing the same.

2. Background of the Related Art

Semiconductor devices may include a power semiconductor element and such a semiconductor device may be used as a power converting device or a switching device. As one example, it is possible to configure a semiconductor device that functions as a switching device by connecting semiconductor chips, including IGBT (Insulated Gate Bipolar Transistors), power MOSFET (Metal Oxide Semiconductor Field Effect Transistors), and the like.

Some semiconductor devices include a laminated substrate, which is equipped with an insulating plate with a circuit board formed on a front surface and a metal plate formed on a rear surface, and one or more semiconductor chips mounted via solder on the circuit board. The laminated substrate is provided on a heat sink. Connection terminals of the semiconductor device are molded and fixed inside a case, with one end of the respective connection terminals being joined to the circuit board (see, for example, Japanese Laid-open Patent Publication No. 2010-098036).

However, when the semiconductor device described above heats up due to a large passing current, a difference in the coefficient of thermal expansion between the laminated substrate and the heat sink may cause warping of the laminated substrate and the heat sink, leading to the risk of stress being produced at the joined surfaces of the connection terminals and the circuit board. The stress that acts upon the joined surfaces becomes especially large since the connection terminals are fixed to the case. This increases the risk of the connection terminals becoming detached from the circuit board and/or breaking.

SUMMARY OF THE INVENTION

In one aspect of the embodiments, there is provided a semiconductor device including: a semiconductor chip; a laminated substrate including an insulating plate, a circuit board that is provided on a front surface of the insulating plate and on which the semiconductor chip is disposed, and a metal plate that is provided on a rear surface of the insulating plate; a heat sink on which the laminated substrate is disposed such that the metal plate is joined to the heat sink; a case in which the semiconductor chip and the laminated substrate are housed; and a connection terminal that has an internal joint portion at one end which is joined to the circuit board, a central portion that is embedded in the case, and an external joint portion at another end that is exposed from the case, and is provided, between an inner surface of the case and the internal joint portion, with a shock-absorbing portion that absorbs stress that acts upon the internal joint portion.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 5A and 5B depict an ultrasonic bonding apparatus according to the embodiment.

DETAILED DESCRIPTION OF THE INVENTION

Figure 1:
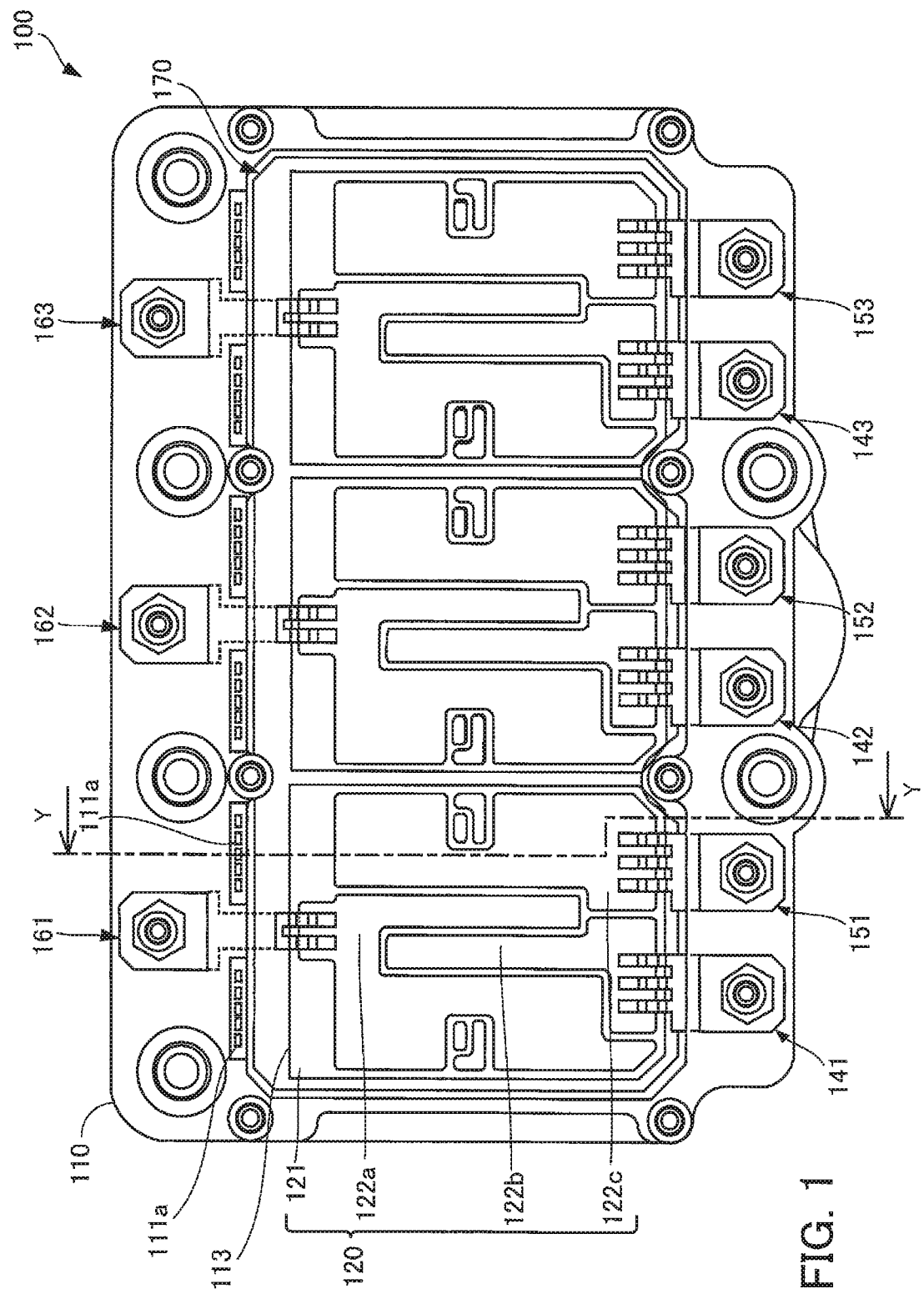
FIG. 1 is a plan view of a semiconductor device according to an embodiment.

Several embodiments will be described below with reference to accompanying drawings, wherein like reference numerals refer to like elements throughout. A semiconductor device will be described first with reference to FIGS. 1 and 2.

FIG. 1 is a plan view of a semiconductor device according to an embodiment.

Figure 2:
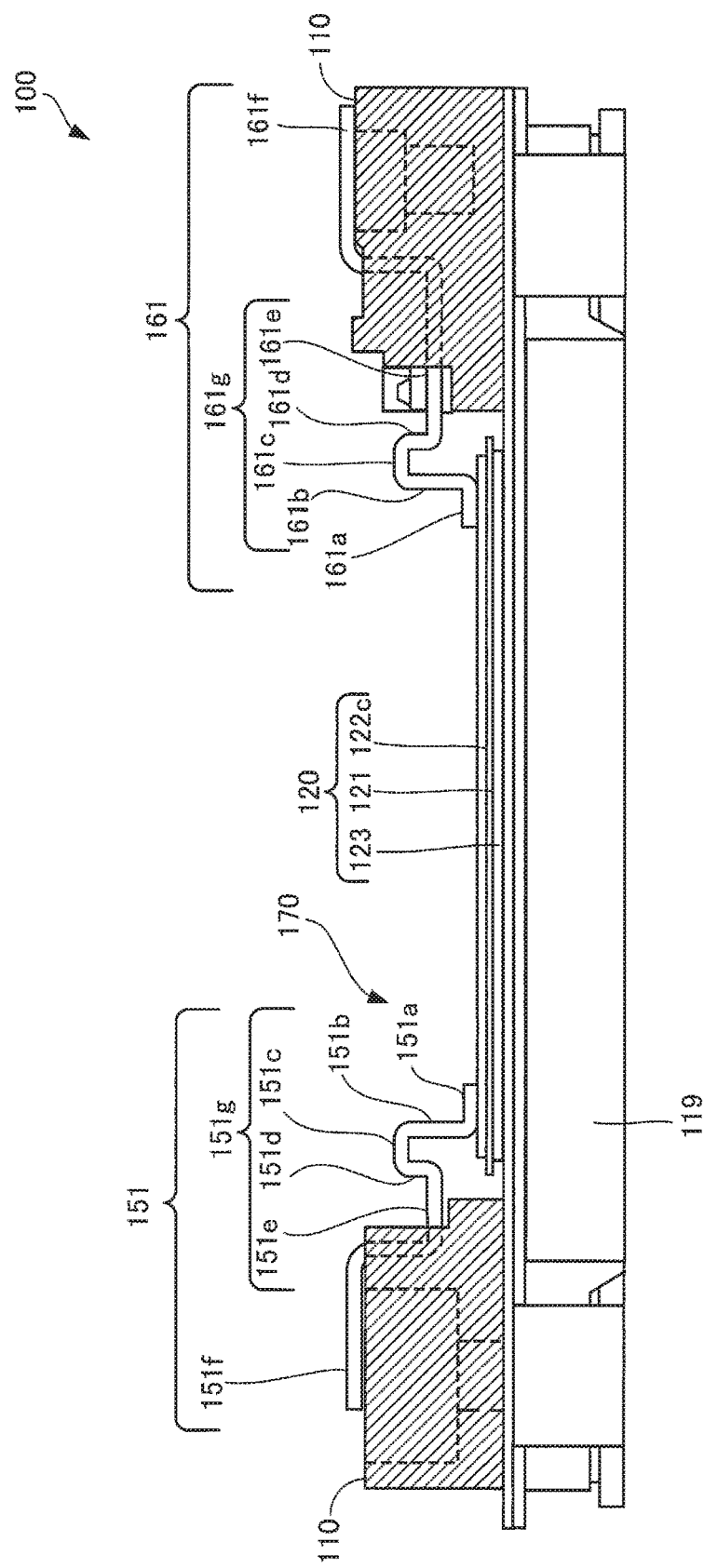
FIG. 2 is a cross-sectional view of the semiconductor device according to the embodiment.

FIG. 2 is a cross-sectional view of the semiconductor device according to the embodiment.

Note that FIG. 2 is a cross-sectional view taken along the dot-dash line Y-Y in FIG. 1 and that wires that connect the semiconductor chips and the circuit board have been omitted from FIG. 2.

The semiconductor device 100 includes a case 110 and three laminated substrates 120 housed in a housing 170 provided in a center portion of the case 110. The laminated substrates 120 are provided on a heat sink 119 which is made of aluminum, copper or the like so as to have superior heat dissipation (see FIG. 2).

The case 110 is formed by injection molding using resin so as to be integrally formed with control terminals 111a, control electrodes (not illustrated) that are electrically connected to the control terminals 111a, P terminals 151, 152, and 153, N terminals 141, 142, and 143, a U terminal 161, a V terminal 162, and a W terminal 163.

Note that in the following description, the expression "connection terminals" is used as a general name for the P terminals 151, 152, and 153, the N terminals 141, 142, and 143, the U terminal 161, the V terminal 162, and the W terminal 163.

Each laminated substrate 120 has a metal plate 123 formed on a rear surface of an insulating plate 121 and circuit boards 122a, 122b, and 122c made of copper for example formed on a front surface of the insulating plate 121. The insulating plate 121 is made of an insulating material such as aluminum oxide, silicon nitride, or aluminum nitride. The metal plate 123 is made of aluminum, copper, or the like so as to have superior heat dissipation. The circuit boards 122a, 122b, and 122c are made of copper or the like so as to conduct electricity. Semiconductor chips (not illustrated) are disposed via solder on the circuit board 122a. Semiconductor chips (not illustrated) are also disposed via solder on the circuit board 122c. These semiconductor chips include IGBT, power MOSFETs, and FWD (FreeWheeling Diode), for example.

Next, the connection terminals (the P terminals 151, 152, and 153, the N terminals 141, 142, and 143, the U terminal 161, the V terminal 162, and the W terminal 163) will be described.

The U terminal 161 will be described as one example of a connection terminal.

As depicted in FIGS. 1 and 2, the U terminal 161 includes an internal joint portion 161a that is electrically joined to the circuit board 122a. The internal joint portion 161a is joined to the circuit board 122a by ultrasonic bonding. In addition, the U terminal 161 has a first member 161b that is connected to an end of the internal joint portion 161a so as to extend upward perpendicular to a main surface of the laminated substrate 120, a second member 161c that is connected to an end of the first member 161b so as to extend in parallel with the main surface of the laminated substrate 120, a third member 161d that is connected to an end of the second member 161c so as to extend downward perpendicular to the main surface of the laminated substrate 120, and a fourth member 161e that is connected to an end of the third member 161d so as to extend in parallel with the main surface of the laminated substrate 120 and is embedded in the case 110. In addition, the U terminal 161 includes an external joint portion 161f that is connected at one end to the fourth member 161e inside the case 110 and has another end that is exposed from the case 110. The first member 161b, the second member 161c, the third member 161d, and the fourth member 161e of the U terminal 161 form a shock-absorbing portion 161g that is curved so as to protrude upwards in FIG. 2.

In the same way as the U terminal 161 and as depicted in FIG. 2, the P terminal 151 that is another example of a connection terminal includes an internal joint portion 151a, a first member 151b, a second member 151c, a third member 151d, a fourth member 151e, and an external joint portion 151f. With this configuration, the first member 151b, the second member 151c, the third member 151d, and the fourth member 151e of the P terminal 151 form a shock-absorbing portion 151g that is curved so as to protrude upwards in FIG. 2. While the P terminal 151 is depicted as having a first member 151b, second member 151c, and third member 151d that are substantially rectangular in shape, having rounded joining portions (or in other words, the second member 151c is substantially perpendicular to the first member 151b and the third member 151c), the invention is not limited to the depicted embodiment. A shock-absorbing portion according to embodiments of the invention may include any structure of the connection terminal in which the connection terminal exits, or contacts, the case at a first point, rises to a height above the height of the first point, and then drops down to contact the circuit board at the internal joint portion. Other shapes of a shock absorbing member may include an entirely rounded or ovoid shape, a mixed shape having some lines and some rounded or ovoid portions, a peak shape in which the connection terminal extends in a substantially straight line to a height above that of the first point and then drops in a substantially straight line to contact the circuit board. While a few examples are provided, the invention is not limited to the described examples, but encompasses any shock-absorbing portion in which the connection terminal exits, or contacts, the case at a first point, rises to a height above the height of the first point, and then drops down to contact the circuit board at the internal joint portion.

In the same way as the U terminal 161 and the P terminal 151, the other connection terminals have a first member, a second member, a third member, a fourth member, and an external joint portion, with the first to fourth members forming a shock-absorbing portion that is curved so as to protrude upwards.

Note that the internal joint portions of the P terminals 152 and 153 are joined to the circuit boards 122c, the internal joint portions of the N terminals 141, 142, and 143 are joined to the circuit boards 122b, and the internal joint portions of the V terminal 162 and the W terminal 163 are joined to the circuit boards 122a.

The control terminals 111a are electrically connected to control electrodes, such as the gate electrodes, of the semiconductor chips by wires (not illustrated) from the control electrodes.

The P terminals 151, 152, and 153 are electrically connected to rear-surface electrodes of semiconductor chips via the circuit boards 122c in a state where the P terminals 151, 152, and 153 are electrically connected to external positive electrodes.

The N terminals 141, 142, and 143 are electrically connected to front-surface electrodes of the semiconductor chips by wires (not illustrated) in a state where the N terminals 141, 142, and 143 are electrically connected to external negative electrodes.

The U terminal 161, the V terminal 162, and the W terminal 163 are electrically connected to rear-surface electrodes of the semiconductor chips via the circuit boards 122a. The U terminal 161, the V terminal 162, and the W terminal 163 are also electrically connected to front-surface electrodes of the semiconductor chips by wires (not illustrated).

In the semiconductor device 100, the housing 170 is filled with a sealant (not illustrated) such as gel or potting resin so that the laminated substrates 120 and the (housing 170—sides of) P terminals 151, 152, and 153, the N terminals 141, 142, and 143, the U terminal 161, the V terminal 162, the W terminal 163, and the wires 113 are sealed by the sealant (not illustrated).

Here, another semiconductor device will be described with reference to FIG. 3 as a comparative example to be compared with the semiconductor device 100.

Figure 3:
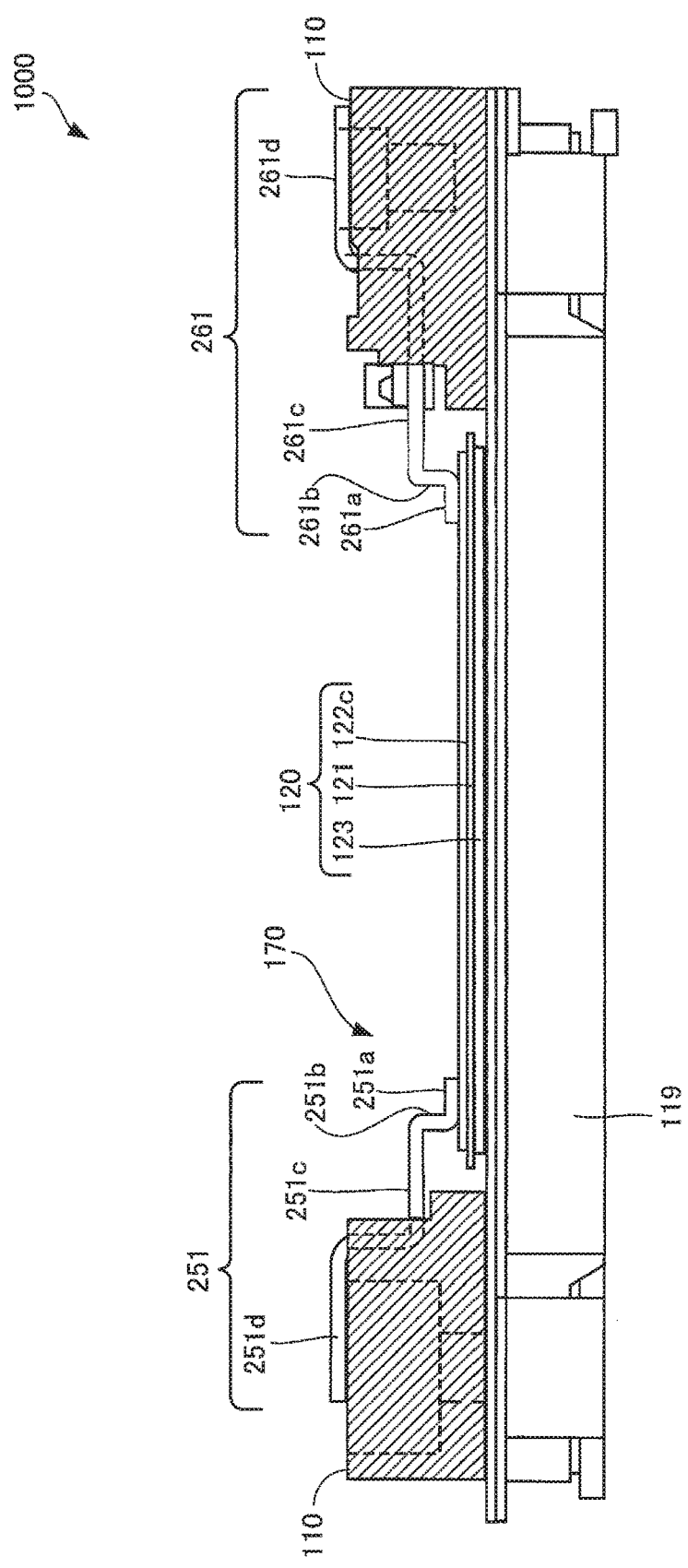
FIG. 3 is a cross-sectional view of a semiconductor device used as a comparative example.

FIG. 3 is a cross-sectional view of the semiconductor device used as the comparative example.

Note that aside from the connection terminals, the semiconductor device 1000 has the same configuration as the semiconductor device 100 (see FIG. 1 for a plan view of the semiconductor device 1000).

Out of the connection terminals of the semiconductor device 1000, a U terminal 261 and a P terminal 251 will now be described.

Like FIG. 2, FIG. 3 is a cross-sectional view of the semiconductor device 1000 along the dot-dash line Y-Y in FIG. 1.

In the semiconductor device 1000, as depicted in FIG. 3 (and FIG. 1), the U terminal 261 has an internal joint portion 261a that is electrically joined to a circuit board 122a. The internal joint portion 261a is joined by ultrasonic bonding to the circuit board 122a. In addition, the U terminal 261 has a first member 261b that is connected to an end of the internal joint portion 261a so as to extend upward perpendicular to a main surface of the laminated substrate 120 and a second member 261c that is connected to an end of the first member 261b so as to extend in parallel with the main surface of the laminated substrate 120. The U terminal 261 also has an external joint portion 261d that is connected at one end to the second member 261c inside the case 110 and has another end that is exposed from the case 110.

In the same way as the U terminal 261 and as depicted in FIG. 3, the P terminal 251 that is another example of a connection terminal of the semiconductor device 1000 has an internal joint portion 251a, a first member 252b, a second member 252c, and an external joint portion 251d.

In the same way as the U terminal 261 and the P terminal 251, the other connection terminals each have an internal joint portion, a first member that is connected to an end of the internal joint portion so as to extend upward perpendicular to the main surface of the laminated substrate 120, a second member that is connected to the first member so as to extend in parallel with the main surface of the laminated substrate 120, and an external joint portion that has one end connected to the second member inside the case 110 and the other end exposed from the case 110.

The thicknesses of these connection terminals is around 0.5 mm to 1.5 mm inclusive, for example. Here, it is assumed that the thicknesses and widths of the connection terminals are substantially uniform across the entire lengths of the terminals with no narrow parts being formed.

For the semiconductor device 1000 also, the housing 170 is filled with a sealant (not illustrated) such as gel or potting resin so that the laminated substrates 120 and the (housing 170—side) connection terminals, such as the P terminal 251 and the U terminal 261, and the wires 113 are sealed by the sealant (not illustrated).

When the semiconductor device 1000 is used in a vehicle, for example, it is believed that this will involve use in environments with large changes in external temperature. During operation, the semiconductor device 1000 itself also emits heat due to the passage of large currents. Due to heat inside and outside the semiconductor device 1000, the case 110, the laminated substrates 120 and the heat sink 119 become compressed and/or contract, resulting in local deformation in the device or deformation of the device as a whole. In particular, there are cases where warping occurs due to the difference in the coefficient of thermal expansion between the laminated substrates 120 and the heat sink 119. At one end, the U terminal 261 has an internal joint portion 261a that is fixed to the circuit board 122a and at the other end is embedded in the case 110. This means that with the semiconductor device 1000, when there is local deformation in the device or deformation of the device as a whole, stress is concentrated at the joint between the internal joint portion 261a and the circuit board 122a. This results in the risk of the internal joint portion 261a of the U terminal 261 becoming detached from the circuit board 122a and of the U terminal 261 breaking.

For this reason, in the semiconductor device 100 depicted in FIGS. 1 and 2, each connection terminal, for example, the U terminal 161 is configured such that between the internal joint portion 161a and an inner surface of the case 110, the shock-absorbing portion 161g that is curved so as to protrude upward in FIG. 2 is constructed of the first member 161b, the second member 161c, the third member 161d, and the fourth member 161e. With this configuration, even if the semiconductor device 100 as a whole deforms or there is local deformation at parts of the semiconductor device 100 and stress becomes concentrated at the joined surfaces of the internal joint portion 161a and the circuit board 122a, the stress will be absorbed by the shock-absorbing portion 161g.

This means that in the semiconductor device 100, detachment of the internal joint portion 161a of the U terminal 161 from the circuit board 122a and breakage of the U terminal 161 are avoided. Accordingly, with the semiconductor device 100, the U terminal 161 has an increased lifespan, thereby avoiding a drop in device reliability.

Next, the results of simulating stress at a connection terminal (for example, the U terminal 161) of the semiconductor device 100 and a connection terminal (for example, the U terminal 261) of the semiconductor device 1000 and predicted resistance to thermal cycles will be described with reference to FIGS. 4A and 4B.

Figure 4A:
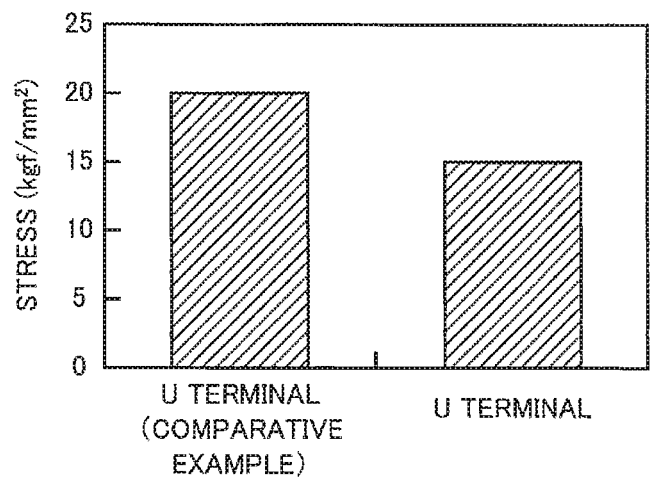
FIGS. 4A and 4B are graphs depicting stress and predicted resistance to thermal cycles for connection terminals of the semiconductor device according to the embodiment.
Figure 4B:
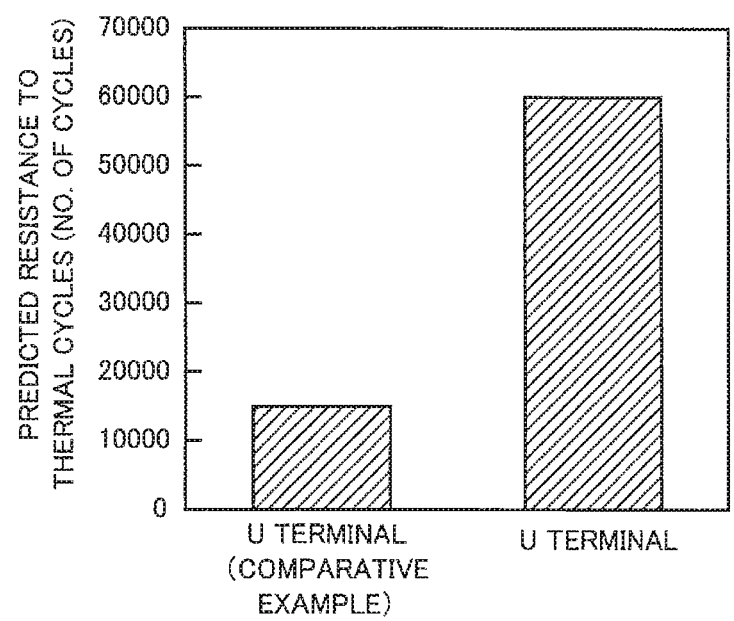

FIGS. 4A and 4B are graphs depicting stress and predicted resistance to thermal cycles for connection terminals of the semiconductor device according to the present embodiment.

Note that in FIGS. 4A and 4B depict a case that relates to the U terminals 161 and 261 as examples of the connection terminals. However, the results depicted in FIGS. 4A and 4B are not limited to the U terminals 161 and 261 and similar results are obtained for the other connecting members.

FIG. 4A is a graph depicting simulation results for stress at the joint portions of the U terminals 161 and 261. The horizontal axis depicts the U terminal 161 and the U terminal 261 (the comparative example) and the vertical axis depicts stress (in $kgf/mm^2$).

In FIG. 4B, the horizontal axis depicts one of the semiconductor device 100 and the semiconductor device 1000 (the comparative example) and the vertical axis depicts the predicted resistance to thermal cycles (in number of cycles).

In the stress simulation and for the predicted resistance to thermal cycles, it is assumed that silicon nitride is used for the insulating plate 121 of the laminated substrates 120 in the semiconductor devices 100 and 1000, copper is used for the connection terminals (that is, the P terminals, N terminals, U terminals, V terminals, and W terminals), and gel is used as the sealant.

As the stress simulation, FEM (Finite Element Method) was used on the connection terminals (the U terminals 161 and 261) to analyze the stress on the connection terminals (the U terminals 161 and 261).

To find the predicted resistance to thermal cycles, the temperature of the semiconductor devices 100 and 1000 was raised from minus 40° C. to 125° C. over a predetermined period and then lowered from 125° C. to minus 40° C. over a predetermined period as one cycle. Here, the number of the cycle where a fatigue limit, at which a problem such as the joints of the U terminals 161 and 261 becoming detached from the circuit board 122b or the U terminals 161 and 261 breaking, is reached was calculated from the stress in FIG. 4A and a fatigue life curve (not illustrated).

First, from the results of the stress simulation depicted in FIG. 4A, it can be understood that the stress at the U terminal 161 of the semiconductor device 100 is lower than the stress at the U terminal 261 of the semiconductor device 1000 (the comparative example).

As depicted in FIG. 4B, it was also understood that the semiconductor device 100 including the U terminal 161 has around four times the predicted resistance to thermal cycles as the semiconductor device 1000 that includes the U terminal 261 (the comparative example).

In this way, the semiconductor device 100 has the laminated substrates 120 that include the insulating plate 121, the circuit boards 122a, 122b, 122c that are provided on the front surface of the insulating plate 121 and on which semiconductor chips 131 to 134 are disposed, and the metal plate 123 provided on the rear surface of the insulating plate 121. The semiconductor device 100 also includes the heat sink 119 on which the laminated substrates 120 are disposed so that the metal plates 123 are joined to the heat sink 119, the semiconductor chips 131 to 134, and the case 110 that houses the laminated substrates 120. The semiconductor device 100 has the U terminal 161 whose internal joint portion 161a at one end is bonded to the circuit board 122a, whose central portion is embedded in the case 110, whose external joint portion 161f at the other end is exposed from the case 110, and is provided, between an inner surface of the case 110 and the internal joint portion 161a, with the shock-absorbing portion 161g that absorbs stress that acts upon the internal joint portion 161a. The shock-absorbing portion 161g of the U terminal 161 is constructed of the first member 161b that is connected to an end of the internal joint portion 161a so as to extend upward perpendicular to the main surface of the laminated substrate 120, the second member 161c that is connected to an end of the first member 161b so as to extend in parallel with the main surface of the laminated substrate 120, the third member 161d that is connected to an end of the second member 161c so as to extend downward perpendicular to the main surface of the laminated substrate 120, and the fourth member 161e that is connected to an end of the third member 161d so as to extend in parallel with the main surface of the laminated substrate 120 and is embedded in the case 110. The other connection terminals of the semiconductor device 100 also have the same configuration as the U terminal 161.

Since the semiconductor device 100 is provided with the shock-absorbing portion 161g in this way, even if the entire semiconductor device 100 deforms or locally deforms and stress is concentrated at the joined surfaces of the internal joint portion 161a and the circuit board 122a, the stress is absorbed by the shock-absorbing portion 161g. This means that with the semiconductor device 100, detachment of the internal joint portion 161a from the circuit board 122a and breakage of the U terminal 161 are avoided. In the same way as the U terminal 161, detachment of the internal joint portions of the other connection terminals from the circuit boards and breakage of the other connection terminals are avoided. Accordingly, with the semiconductor device 100, the lifespan of the connection terminals is increased, thereby avoiding a drop in device reliability.

Note that as described earlier, it is assumed that the thicknesses and widths of the connection terminals are substantially uniform across the entire lengths of the terminals with no narrow parts being formed. Large currents pass the connection terminals of the semiconductor device 100. When, as one example, parts of the connection terminals are formed thinly so as to bend and absorb stress that acts upon the connection terminals, heat will be generated at thinned parts of the connection terminals when a large current flows, resulting in the risk of high temperatures being produced in the semiconductor device 100. It is therefore desirable for the connection terminals to have substantially uniform thicknesses and widths across their entire lengths. In addition, as illustrated in FIG. 1, the U terminal 161 may have such a configuration that the portion from the internal joint portion 161a to the shock-absorbing portion 161g is split. The same applies to the V terminal 162, W terminal 163, P terminals 151, 152, and 153, and N terminals 141, 142, and 143. For example, the portion may be split into two or three. Each split portion from the internal joint portion to the shock-absorbing portion is narrow in width. However, the connection terminal as a whole has approximately uniform thickness and width across its entire length, as in the case where the portion is not split. This split configuration also allows large currents to pass the connection terminal. Further, the use of connection terminals in the split configuration makes it possible to simplify the joining process, reduce load on the laminated substrates, and absorb stress.

Also as described earlier, with the semiconductor device 100, the connection terminals and the circuit boards are joined by ultrasonic bonding. However, the present embodiment is not limited to ultrasonic bonding and the effects described above are achieved even when the connection terminals and the circuit boards are joined by soldering.

Next, the ultrasonic bonding of the connection terminals to the circuit boards in a method of manufacturing the semiconductor device 100 will be described.

First, an ultrasonic bonding apparatus that performs the ultrasonic bonding will be described with reference to FIGS. 5A and 5B.

FIGS. 5A and 5B depict the ultrasonic bonding apparatus according to the present embodiment.

Note that part (a) of FIG. 5A is a schematic diagram of the ultrasonic bonding apparatus, part (b) of FIG. 5A depicts a contact surface of a contact of the ultrasonic bonding apparatus, and FIG. 5B is front view of another contact.

An ultrasonic bonding apparatus 300 includes an ultrasonic generator 310, an ultrasonic transducer 320 that is connected to the ultrasonic generator 310 and transmits the generated ultrasound, and a contact 330 that is connected to the ultrasonic transducer 320 and presses the connection terminals onto the circuit boards.

The ultrasonic generator 310 vibrates at a predetermined frequency to generate ultrasound.

The ultrasonic transducer 320 is connected to the ultrasonic generator 310 and transmits the generated ultrasound from the ultrasonic generator 310.

The contact 330 is bar-shaped and includes a main body portion 331 and a pressing portion 332 produced by machining the front end of the main body portion 331 to become narrower than the diameter of the main body portion 331. As one example, as depicted in part (b) of FIG. 5A, a contact surface 332a of the pressing portion 332 of the contact 330 is formed so as to be rectangular and presses the internal joint portion of a connection terminal. The contact 330 is connected to the ultrasonic transducer 320 and vibrates in keeping with the vibration of the ultrasonic transducer 320. As a result, it is possible to press a connection terminal onto a circuit board while causing the connection terminal to vibrate.

Note that as another example, as depicted in FIG. 5B, it is also possible for the contact 330 to be formed in a T shape. With a T-shaped contact 330, it is possible to collectively press a plurality of connection terminals onto circuit boards while causing the connection terminals to vibrate.

Note also that with the ultrasonic bonding apparatus 300, it is possible to cause the contact 330 to vibrate in the x direction and the y direction in FIG. 5A in keeping with the direction of vibration of the ultrasonic generator 310.

Next, ultrasonic bonding of a connection terminal onto a circuit board by the ultrasonic bonding apparatus 300 depicted in FIG. 5A will be described with reference to FIGS. 6A and 6B.

Figure 6A:
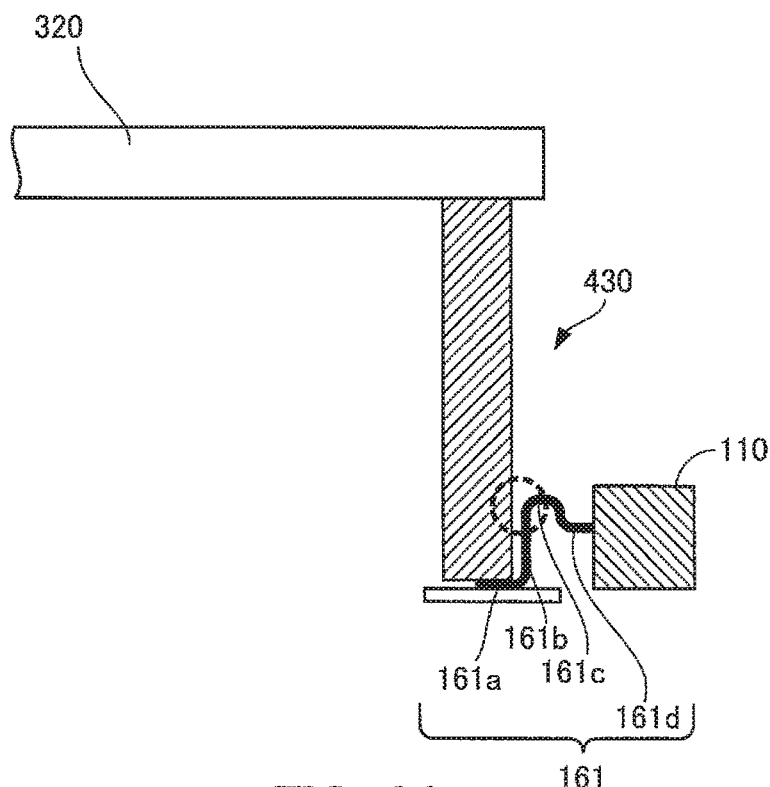
FIGS. 6A and 6B depict ultrasonic bonding for the semiconductor apparatus according to the embodiment.
Figure 6B:
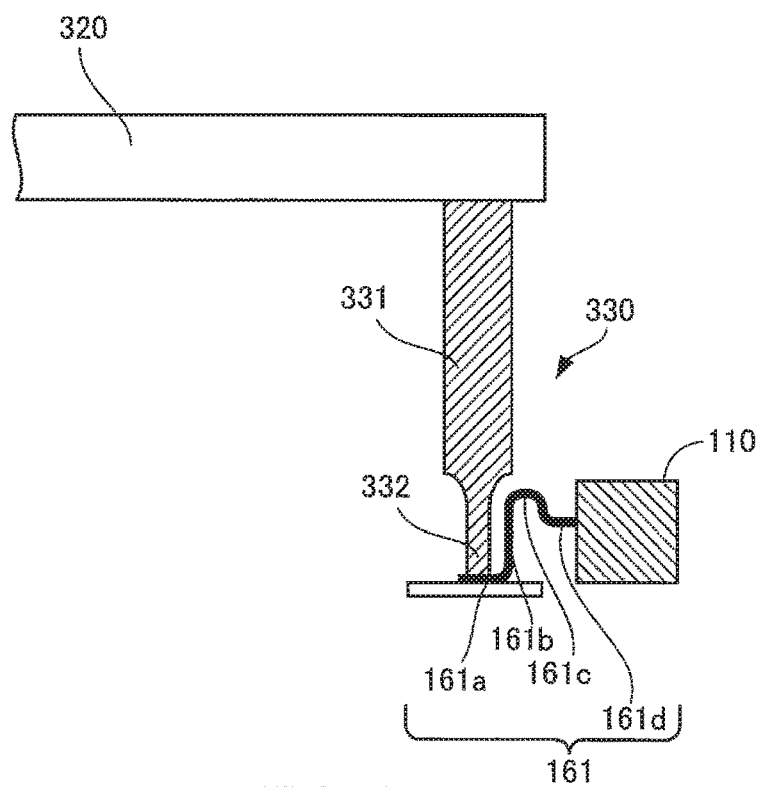

FIGS. 6A and 6B depict ultrasonic bonding for the semiconductor apparatus according to the present embodiment.

Note that FIG. 6A depicts ultrasonic bonding by a contact 430 that is a comparative example to be compared with the contact 330 of the ultrasonic bonding apparatus 300 and FIG. 6B depicts ultrasonic bonding by the contact 330 of the ultrasonic bonding apparatus 300.

Note that before ultrasonic bonding is performed, the heat sink 119, the laminated substrates 120, and the semiconductor chips 131 to 134 are stacked in that order. The laminated substrates 120 and the semiconductor chips 131 to 134 are then housed inside the case 110.

After this, as described below, the ultrasonic bonding apparatus 300 is used to join the connection terminals to the circuit boards by ultrasonic bonding.

First, a configuration where the ultrasonic bonding apparatus 300 includes the contact 430 as a comparative example for the contact 330 will be described.

As depicted in FIG. 6A, the contact 430 is formed in a bar shape that extends in a straight line with a width (and thickness) that is uniform along the entire contact 430. With this configuration, when a connection terminal (for example, the U terminal 161) of the semiconductor device 100 is ultrasonically bonded to the circuit board 122a, there is a risk of the contact 430 interfering with the U terminal 161 (at the position surrounded by the dotted circle in FIG. 6A). When the contact 430 interferes with the U terminal 161, there is the risk that ultrasound will not be appropriately transmitted from the contact 430 to the U terminal 161, so that it will not be possible to appropriately perform ultrasonic bonding of the U terminal 161 and the circuit board 122a.

For this reason, the ultrasonic bonding apparatus 300 uses the contact 330 that includes the main body portion 331 and the pressing portion 332 that is produced by machining so that the front end of the main body portion 331 is narrower than the diameter of the main body portion 331. As depicted in FIG. 6B, the contact 330 is capable of pressing the circuit board 122b while applying vibration to the internal joint portion 161a of the U terminal 161 without interfering with the U terminal 161, which makes it possible to ultrasonically bond the internal joint portion 161a to the circuit board 122b.

According to the present embodiments, it is possible to avoid a drop in the reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor device comprising:
   a semiconductor chip;
   a laminated substrate including an insulating plate, a circuit board that is provided on a front surface of the insulating plate and on which the semiconductor chip is disposed, and a metal plate that is provided on a rear surface of the insulating plate;
   a heat sink on which the laminated substrate is disposed such that the metal plate is joined to the heat sink;
   a case in which the semiconductor chip and the laminated substrate are housed; and
   a connection terminal that has
      a plurality of internal joint portions at one end which are joined to the circuit board,
      a central portion that is embedded in the case and protrudes from the case towards the internal joint portions at a first point, and
      an external joint portion at another end that is exposed from the case,
   wherein the connection terminal includes a plurality of shock-absorbing portions located between an inner surface of the case and the internal joint portions, the shock-absorbing portions that are being shaped so as to absorb stress that acts upon the internal joint portions, each of the shock-absorbing portions including a bend such that a portion of the connection terminal between the case and the circuit board is farther from the circuit board, in a height direction, than the first point.

2. The semiconductor device according to claim 1, wherein each of the shock-absorbing portions includes:
   a first member that is connected to an end of one of the internal joint portions so as to extend upward perpendicular to a main surface of the laminated substrate;
   a second member that is connected to an end of the first member so as to extend in parallel with the main surface of the laminated substrate;
   a third member that is connected to an end of the second member so as to extend downward perpendicular to the main surface of the laminated substrate; and
   a fourth member that is connected to an end of the third member so as to extend in parallel with the main surface of the laminated substrate,
   wherein the fourth member is embedded in the case, and
   wherein the fourth member has an end portion that is connected to an end of the external joint portion.

3. The semiconductor device according to claim 1, wherein the connection terminal has a uniform thickness and width across the entire connection terminal.

4. The semiconductor device according to claim 1, wherein each of the internal joint portions is ultrasonically bonded to the circuit board.

5. The semiconductor device according to claim 1, wherein the internal joint portion is soldered to the circuit board.

6. The semiconductor device according to claim 1, wherein the connection terminal exits the case extending along a plane parallel to an upper surface of the circuit board, each of the internal joint portions rests on the upper surface of the circuit board and extends parallel to the upper surface of the circuit board, and a portion of the connection terminal between the case and each of the internal joint portions has a peak height higher than the first point where the connection terminal protrudes from the case.

7. The semiconductor device according to claim 1, wherein the plurality of shock-absorbing portions are respectively located between the inner surface of the case and the plurality of internal joint portions, each for absorbing stress that acts upon the respective internal joint portion.

8. The semiconductor device according to claim 1, wherein the external joint, the central portion and the plurality of internal joint portions of the connection terminal form a fork-like structure.

9. The semiconductor device according to claim 1, wherein the shock-absorbing portions extend from the central potion and connect respectively to the internal joint portions.

10. A semiconductor device, comprising:
   a semiconductor chip;
   a laminated substrate including an insulating plate, a circuit board that is provided on a front surface of the insulating plate and on which the semiconductor chip is disposed, and a metal plate that is provided on a rear surface of the insulating plate;
a heat sink on which the laminated substrate is disposed such that the metal plate is joined to the heat sink;
a case in which the semiconductor chip and the laminated substrate are housed; and
a connection terminal that has
- a plurality of internal joint portions at one end which are joined to the circuit board,
- a central portion that is embedded in the case and protrudes from the case towards the internal joint portions at a first point, and
- an external joint portion at another end that is exposed from the case, wherein the connection terminal includes a plurality of shock-absorbing portions located between an inner surface of the case and the internal joint portions, the shock-absorbing portions that are being shaped so as to absorb stress that acts upon the internal joint portions, each of the shock-absorbing portions including a bend such that a portion of the connection terminal between the case and the circuit board is farther from the circuit board, in a height direction, than the first point, and wherein, in a plan view thereof, a width of each of the shock-absorbing portions is narrower than a width of the central portion.

11. A semiconductor device comprising:
a semiconductor chip;
a laminated substrate including an insulating plate, a circuit board that is provided on a front surface of the insulating plate and on which the semiconductor chip is disposed, and a metal plate that is provided on a rear surface of the insulating plate;
a heat sink on which the laminated substrate is disposed such that the metal plate is joined to the heat sink;
a case in which the semiconductor chip and the laminated substrate are housed; and
a connection terminal that has
- a plurality of internal joint portions that are at one end of the connection terminal and are joined to the circuit board,
- a central portion that is embedded in the case and protrudes from the case towards the internal joint portions at a first point, and
- an external joint portion that is at another end of the connection terminal and is exposed from the case, wherein the connection terminal includes a plurality of shock-absorbing portions located between an inner surface of the case and the internal joint portions, the shock-absorbing portions that are being shaped so as to absorb stress that acts upon the internal joint portions, each of the shock-absorbing portions including a bend such that a portion of the connection terminal between the case and the circuit board is farther from the circuit board, in a height direction, than the first point.

* * * * *